US008059455B2

(12) United States Patent  
Stern et al.

(10) Patent No.: US 8,059,455 B2  
(45) Date of Patent: Nov. 15, 2011

(54) PARTIAL SCRAMBLING TO REDUCE CORRELATION

(75) Inventors: Ori Stern, Modyin (IL); Tal Heller, Even Yehuda (IL); Menahem Lasser, Kohav-Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 193 days.

(21) Appl. No.: 12/165,141

(22) Filed: Jun. 30, 2008

(65) Prior Publication Data

US 2009/0279362 A1 Nov. 12, 2009

Related U.S. Application Data

(60) Provisional application No. 61/051,997, filed on May 9, 2008.

(51) Int. Cl.  
*G11C 11/34* (2006.01)

(52) U.S. Cl. ......... 365/185.02; 365/185.17; 365/185.18; 365/185.19; 711/163; 711/102; 711/103; 711/48

(58) Field of Classification Search .............. 365/185.18, 365/185.02, 185.28, 185.17, 185.19; 711/163, 711/102, 103, 48  
See application file for complete search history.

(56) References Cited

U.S. PATENT DOCUMENTS

| | | | |
|---|---|---|---|
| 5,592,436 A * | 1/1997 | Toda | 365/240 |
| 5,943,283 A | 8/1999 | Wong et al. | |
| 6,094,368 A | 7/2000 | Ching | |
| 6,307,776 B1 | 10/2001 | So et al. | |
| 6,549,468 B2 | 4/2003 | Zitlaw et al. | |
| 6,684,289 B1 | 1/2004 | Gonzalez et al. | |
| 6,977,855 B2 | 12/2005 | Callaway et al. | |
| 7,012,835 B2 | 3/2006 | Gonzalez et al. | |
| 7,139,864 B2 | 11/2006 | Bennett et al. | |
| 7,286,070 B2 | 10/2007 | Zoso et al. | |
| 7,464,216 B2 | 12/2008 | Gorobets | |
| 2003/0126451 A1 | 7/2003 | Gorobets | |
| 2005/0066110 A1* | 3/2005 | Raz et al. | 711/103 |
| 2005/0201401 A1 | 9/2005 | Lasser | |
| 2005/0213393 A1 | 9/2005 | Lasser | |

(Continued)

FOREIGN PATENT DOCUMENTS

JP 2005-056573 A 3/2005

OTHER PUBLICATIONS

U.S. Appl. No. 12/165,160, filed Jun. 30, 2008, entitled "Partial Scrambling to Reduce Correlation," naming inventors Ori Stern, Tal Heller, and Menahem Lasser.

(Continued)

*Primary Examiner* — Pho M Luu  
*Assistant Examiner* — Thao Bui  
(74) *Attorney, Agent, or Firm* — Zagorin O'Brien Graham LLP

(57) ABSTRACT

Decorrelation is provided between data stored in respective pairs of adjacent memory cells in a plurality of bit lines of a flash memory. Each of the pairs of adjacent memory cells is located along a respective one of the bitlines and common to two adjacent wordlines. The decorrelation is achieved by storing scrambled data in at least one memory cell of each of the pairs of adjacent memory cells and storing unscrambled data in at least one memory cell of at least one of the pairs of adjacent memory cells.

14 Claims, 7 Drawing Sheets

U.S. PATENT DOCUMENTS

| | | |
|---|---|---|
| 2006/0026341 A1 | 2/2006 | Lasser |
| 2006/0156189 A1 | 7/2006 | Tomlin |
| 2006/0184724 A1 | 8/2006 | Meir et al. |
| 2007/0089034 A1 | 4/2007 | Litsyn et al. |
| 2007/0124652 A1 | 5/2007 | Litsyn et al. |
| 2007/0208905 A1 | 9/2007 | Litsyn et al. |
| 2007/0217608 A1 | 9/2007 | Shimasaki |
| 2007/0220197 A1 | 9/2007 | Lasser |
| 2008/0151618 A1 | 6/2008 | Sharon et al. |
| 2008/0158948 A1 | 7/2008 | Sharon et al. |
| 2008/0215798 A1* | 9/2008 | Sharon et al. ............ 711/103 |
| 2008/0317246 A1* | 12/2008 | Manders et al. ............ 380/37 |
| 2009/0083485 A1 | 3/2009 | Cheng |
| 2009/0150596 A1 | 6/2009 | Cheng |
| 2009/0204824 A1 | 8/2009 | Lin et al. |
| 2009/0316490 A1* | 12/2009 | Takada ............ 365/185.26 |

OTHER PUBLICATIONS

Liu, Zhen and Karam, Lina J., "Quantifying the Intra and Inter Subband Correlations in the Zero-Tree-Based Wavelet Image Coders," IEEE, 2002, pp. 1730-1734.

Macinnes, Craig S., "DOA Estimation of Nonstationary Coherent Signals Using Signal Vector Randomization," IEEE Transactions on Signal Processing, vol. 46, No. 6, Jun. 1998, pp. 1744-1749.

Non-Final Office Action mailed May 20, 2010 in U.S. Appl. No. 12/165,160, 14 pages.

Final Office Action mailed Oct. 19, 2010 in U.S. Appl. No. 12/165,160, 14 pages.

\* cited by examiner

Inputs:
- dataPtr = Pointer to user buffer containing the data to write
- pageNumber = Physical page number to write to
- *cubeSizeInBytes* = Size of the data cube to alternate the scrambling on
- *defaultShiftReg* = The initial value of the 32 bit shit register.
  This implementation assumes that the register is 32 bits long Pseudo Code:
1. //Convert physical page number to WL number.
   *WLnum = toWL (pageNumber);*
2. //Decide whether to scramble the 1st data cube.
   //Alternates per WL in this example
   *ScrambleThisCube = (WLnum & 0x1) ? FALSE : TRUE;*
3. //Generate Key from pageNumber. In our example convert to a 32 bit key
   *ScrambleKey = toScramblerKey(pageNumber); // pageNumber & 0x1F*
4. //Calculate the initial shift register value based on the scrambling key.
   *ShiftReg =* Rotate *defaultShiftReg* by *ScrambleKey* number of bits;
5. CubeSizeInWord32 = (*cubeSizeInBytes / sizeof (word32)*);
6. *for (int i=0; i < PageSizeInBytes ; i+= cubeSizeInBytes;*
   a. if(*scrambleThisCube == FALSE*)
      i. //Do not perform the scrambling, but update the ShiftReg
         *ShiftReg =* rotate *ShiftReg* by CubeSizeInWord32;
   b. if((*scrambleThisCube == TRUE*)
      i. for (int j = 0; j < CubeSizeInWord32; j++)
         1. *(word32\*)dataPtr[j]* ^= *ShiftReg;* //Scramble Data
         2. *ShiftReg =* rotate *ShiftReg* by 1 bit; //Update register
   c. *scrambleThisCube = !scrambleThisCube;* //Next cube does the opposite
   d. *dataPtr += cubeSizeInBytes;* //Promote the user buffer data pointer.
7. *Return;* //End of scrambling procedure.

FIG. 9

PARTIAL SCRAMBLING TO REDUCE CORRELATION

CROSS-REFERENCE TO RELATED APPLICATION(S)

This application claims benefit of provisional application 61/051,997, filed May 9, 2008, entitled "Partial Scrambling," naming Ori Stern, Tal Heller, and Menahem Lasser as inventors, which application is incorporated herein by reference in its entirety.

This application is related to co-pending application entitled "Partial Scrambling to Reduce Correlation," naming Ori Stern, Tal Heller and Menahem Lasser as inventors, U.S. application Ser. No. 12/165,160, filed Jun. 30, 2008, and which is hereby incorporated by reference in its entirety.

BACKGROUND

1. Field of the Invention

The present invention relates to flash memories and, more particularly, to addressing correlation problems among data in flash memories.

2. Description of the Related Art

Modern NAND flash memories (e.g., 56 nm and smaller) have a strong coupling between adjacent wordlines and are inherently susceptible to specific data patterns. Thus, a write operation to one wordline might cause a programming effect to a different wordline. Specific patterns on the bit lines can result in stronger coupling and, therefore, more likely will result in an undesired programming affect. Such effects are particularly problematic in memory arrays storing multiple bits per cell (MBC arrays), and these effects can cause one or more cells to generate a read error as a function of specific user data patterns. It would be desirable to avoid such undesired programming effects in an efficient manner.

SUMMARY

Accordingly, in one embodiment, a method is provided for decorrelating between data stored in respective pairs of adjacent memory cells in a plurality of bit lines of a flash memory. Each of the pairs of adjacent memory cells is located along a respective one of the bitlines, and each of the pairs of adjacent memory cells is located on two adjacent wordlines common to all the pairs. The method includes storing scrambled data in at least one memory cell of each of the pairs of adjacent memory cells and storing unscrambled data in at least one memory cell of at least one of the pairs of adjacent memory cells.

In another embodiment, an apparatus is provided that includes a NAND flash memory including pairs of adjacent memory cells. Each of the pairs of adjacent memory cells is located along a respective one of a plurality of bitlines and each of the pairs of the adjacent memory cells is located on adjacent first and second wordlines common to all the pairs. A scrambler circuit is coupled to the flash memory and operable to perform selective scrambling on data for the flash memory to scramble data for at least one memory cell of each of the pairs of adjacent memory cells and to leave unscrambled data for at least one memory cell of at least one of the pairs of adjacent memory cells.

BRIEF DESCRIPTION OF THE DRAWINGS

The present invention may be better understood, and its numerous objects, features, and advantages made apparent to those skilled in the art by referencing the accompanying drawings.

FIG. 9 illustrates exemplary pseudo code implementing a scrambling operation according to an embodiment of the invention.

The use of the same reference symbols in different drawings indicates similar or identical items.

DESCRIPTION OF THE PREFERRED EMBODIMENT(S)

Figure 1:
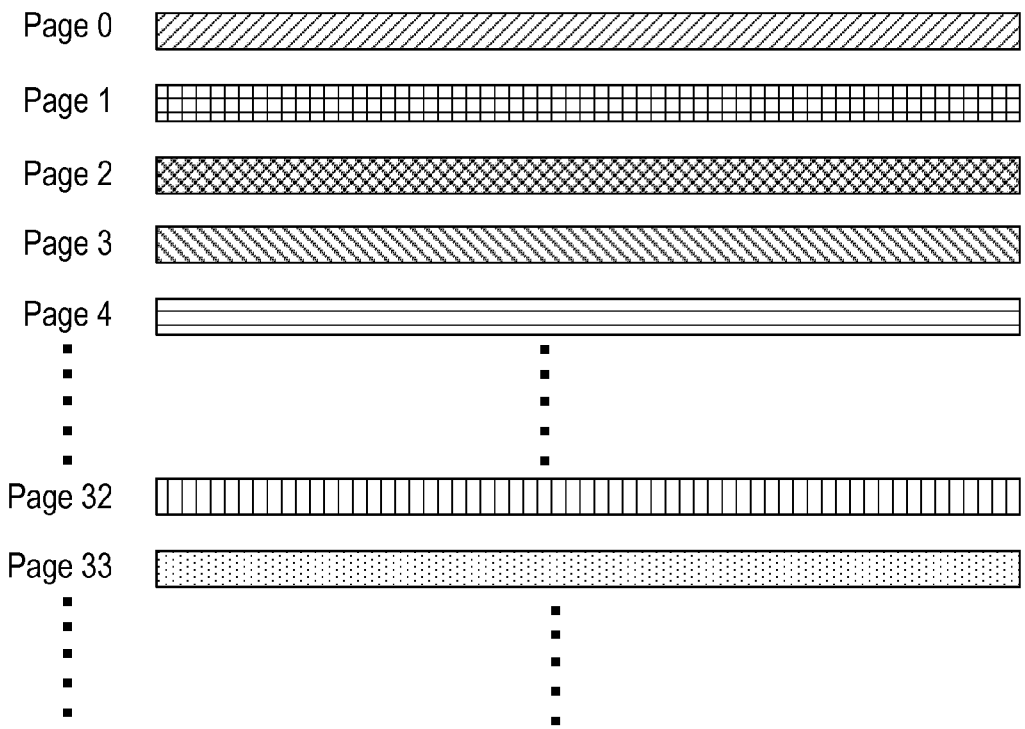
FIG. 1 illustrates an approach to scrambling in which all the data on every page is scrambled.

To address the issue of undesired programming effects due to correlation between wordlines, techniques have been devised using system level data scrambling or randomization to eliminate the particularly problematic data patterns in the user data before programming into a flash memory. The scrambled data is then stored into the flash memory as shown in FIG. 1. One approach, illustrated in FIG. 1, is to scramble or randomize all the data within each page with a different scrambler series. That results in each page using a different scrambling pattern so the most likely problematic user data patterns between pages are eliminated. Thus, as shown in FIG. 1, all the data of each page is scrambled and each page is scrambled with a different scrambler pattern. Note that each of the pages shown in FIG. 1 may be a separate wordline or portion of a wordline. Note also that management information (not shown in FIG. 1), which is typically stored in multiple locations in long wordlines, may not be scrambled in certain implementations.

Figure 2:
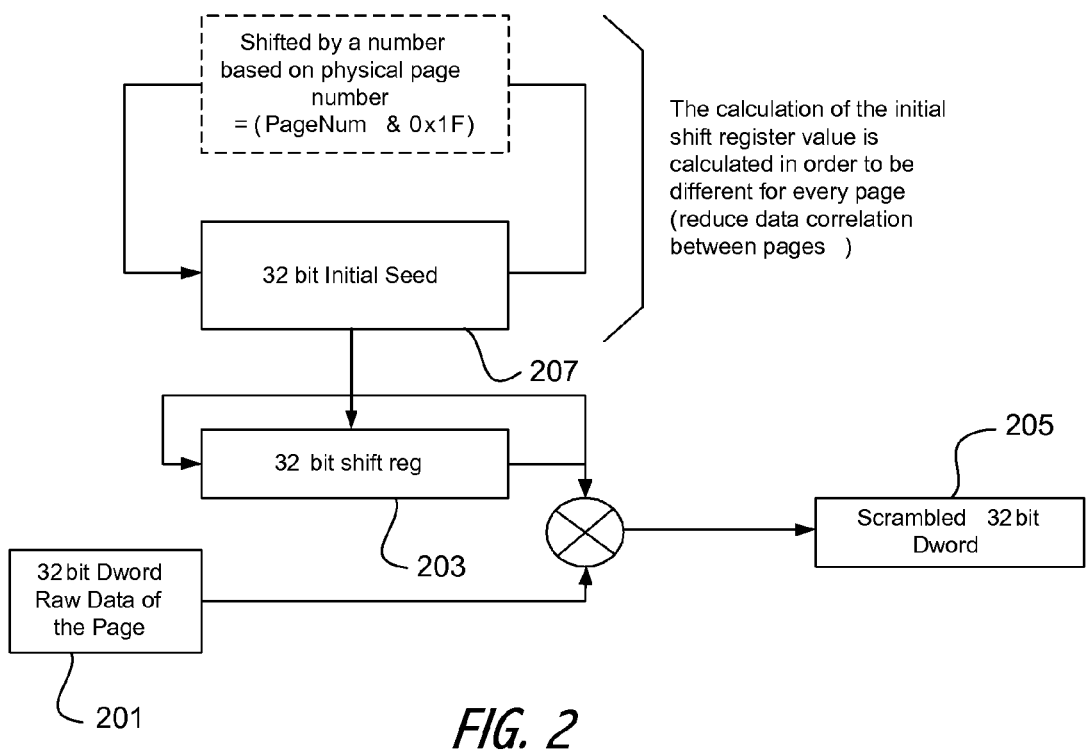
FIG. 2 illustrates a scrambler implementation that may be utilized in an embodiment of the invention.

As used herein, the terms "scrambling" or "randomizing" mean to subject original data to be stored in the flash memory to a randomization or scrambling process prior to storing the data in the flash memory. When reading the scrambled data, that scrambled data has to be unscrambled before use. One embodiment of that randomization process is illustrated with respect to FIG. 2 in which the data is randomized by XORing the data to be stored in the flash memory with a scrambler pattern. That scrambler pattern may be a pseudo-random pattern or a pattern specifically selected to address particular program disturb affects. One embodiment of a scrambler implementation is shown in FIG. 2. The 32-bit data word 201 that is unscrambled is XORed with a 32-bit scrambler pattern in shift register 203 to form a 32-bit scrambled data word 205. Implementations may XOR one or more bits at a time. The initial value of the shift register or seed may be different for every page to reduce correlation between pages. In an exemplary embodiment, a page is 4096 bytes and a wordline is 16384 bytes. Other embodiments may, of course, have different page and wordline sizes.

Figure 3:
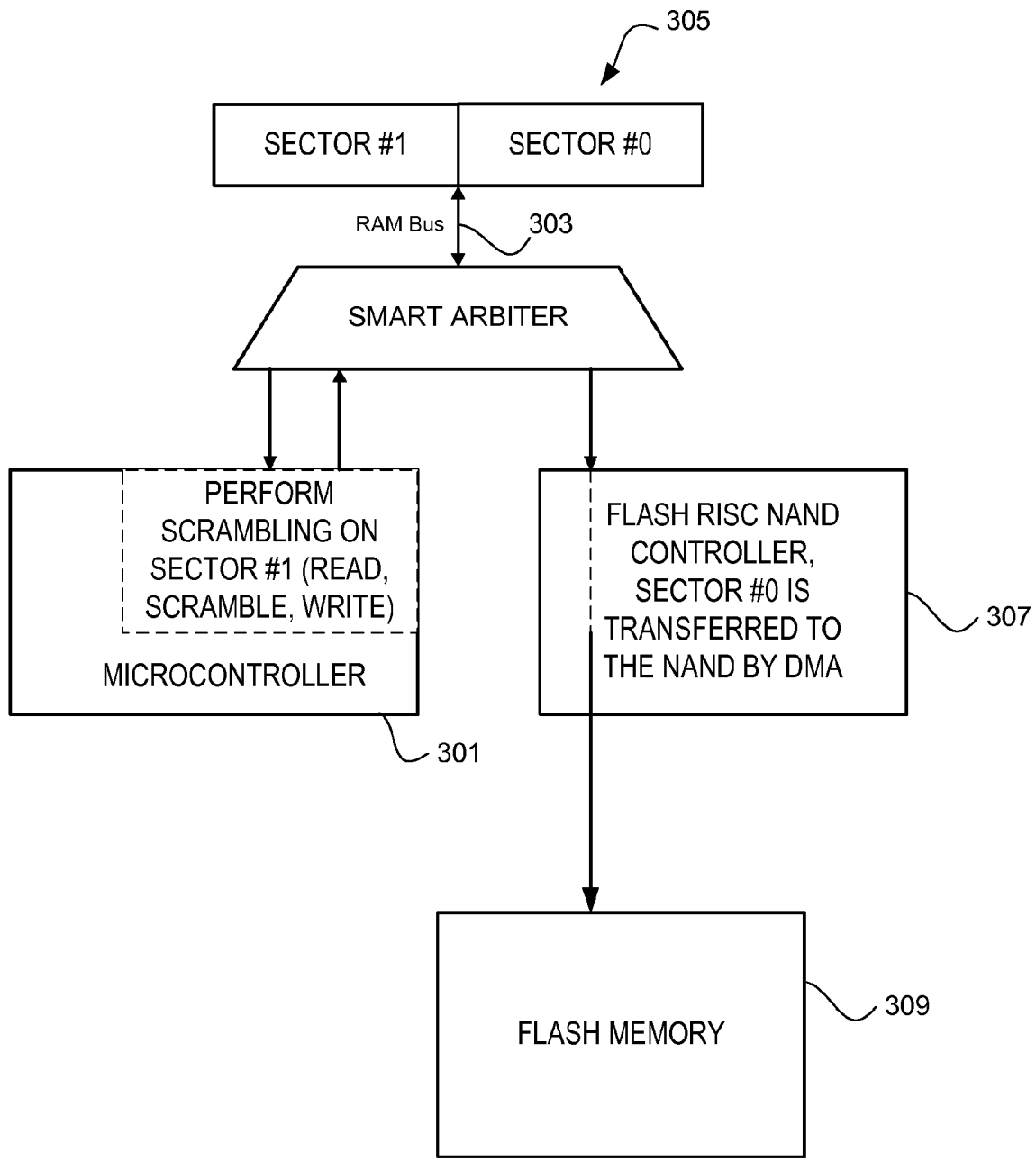
FIG. 3 illustrates a flash memory system that implements scrambling using a microcontroller.

Referring to FIG. 3, in order to implement the scrambling approach in an embodiment, a microcontroller 301 is utilized. Other embodiments may use a hardware solution or a mixture of hardware and software. One problem with the randomization approach described in FIG. 1 is that the bandwidth of RAM bus 303 may not be enough to simultaneously perform multiple operations related to scrambling. For example, assume the microcontroller 303 wants to (1) read sector #1 from the RAM 305, and (2) write scrambled sector #1 back to the RAM. Further assume that the DMA machine in NAND flash controller 307 wants to read scrambled sector #0 from the RAM to write it to the NAND flash memory 309. Contention for the RAM bus 303 between the read and write operations by the microcontroller and the DMA by NAND flash controller 307 can slow the ability to write data to the flash memory or slow the write or read scrambling operations. In addition, microcontroller resources and time are utilized to perform the scrambling operations.

While the approach described with respect to FIG. 1 substantially eliminates undesired correlations between adjacent physical wordlines by scrambling both wordlines, the need for scrambling can reduce the device performance, as described with relation to FIG. 3. Assuming software scrambling, the CPU time may become a bottleneck if CPU processing takes longer than the data path stage. In addition, data buses might become a bottleneck as data is read, scrambled, and returned to the flash memory. When using page copy sequences, pages need to be de-scrambled and re-scrambled with a new page key. Thus, device performance can be adversely affected by the need to scramble to avoid undesired correlation between wordlines.

Figure 4:
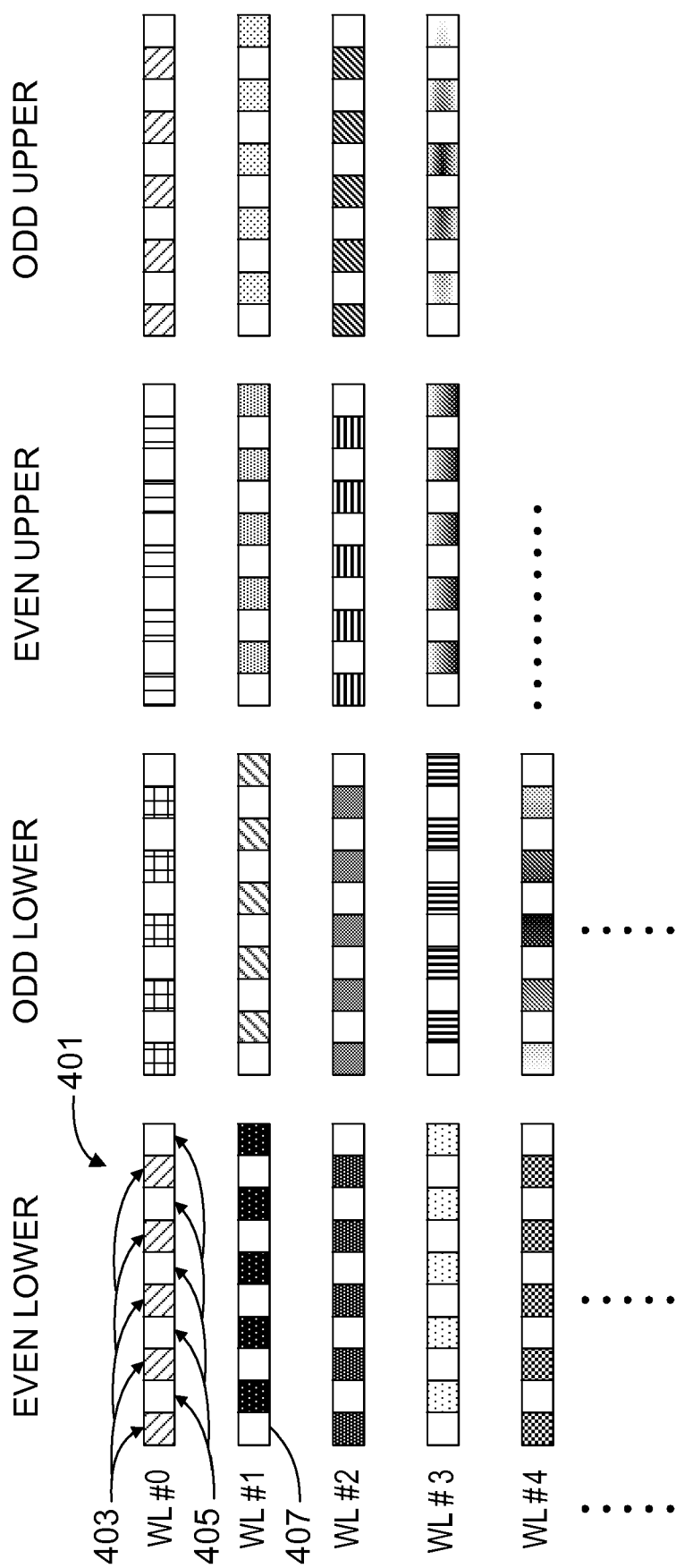
FIG. 4 implements a checkerboard scrambling pattern according to an embodiment of the invention.

Accordingly, an improved scrambling approach is shown in FIG. 4. Rather than scramble or randomize all the bits or cells on each wordline, only half the data or cells need to be scrambled. As shown in FIG. 4, each wordline, WL #0, WL #1, etc., is divided into sections (also referred to herein as cubes) of data. For the first group of sections 401 in WL #0, each of the sections 403 is scrambled, whereas each of the sections 405 is not scrambled. As shown in FIG. 4, on WL #0, half of the sections are scrambled. In WL #1, the other half of the sections are scrambled, i.e., those sections in the locations that are not scrambled in WL #0, so that for any adjacent sections on separate wordlines, at least one is scrambled. Thus, the first section 407 in WL #1, which is adjacent to the first scrambled section in the group of sections 401 in WL #0, is not scrambled. A similar pattern holds for the remaining wordlines shown in FIG. 4, so that adjacent sections in adjacent wordlines are alternatively scrambled and not scrambled as one traverses down the wordlines.

Figure 5:
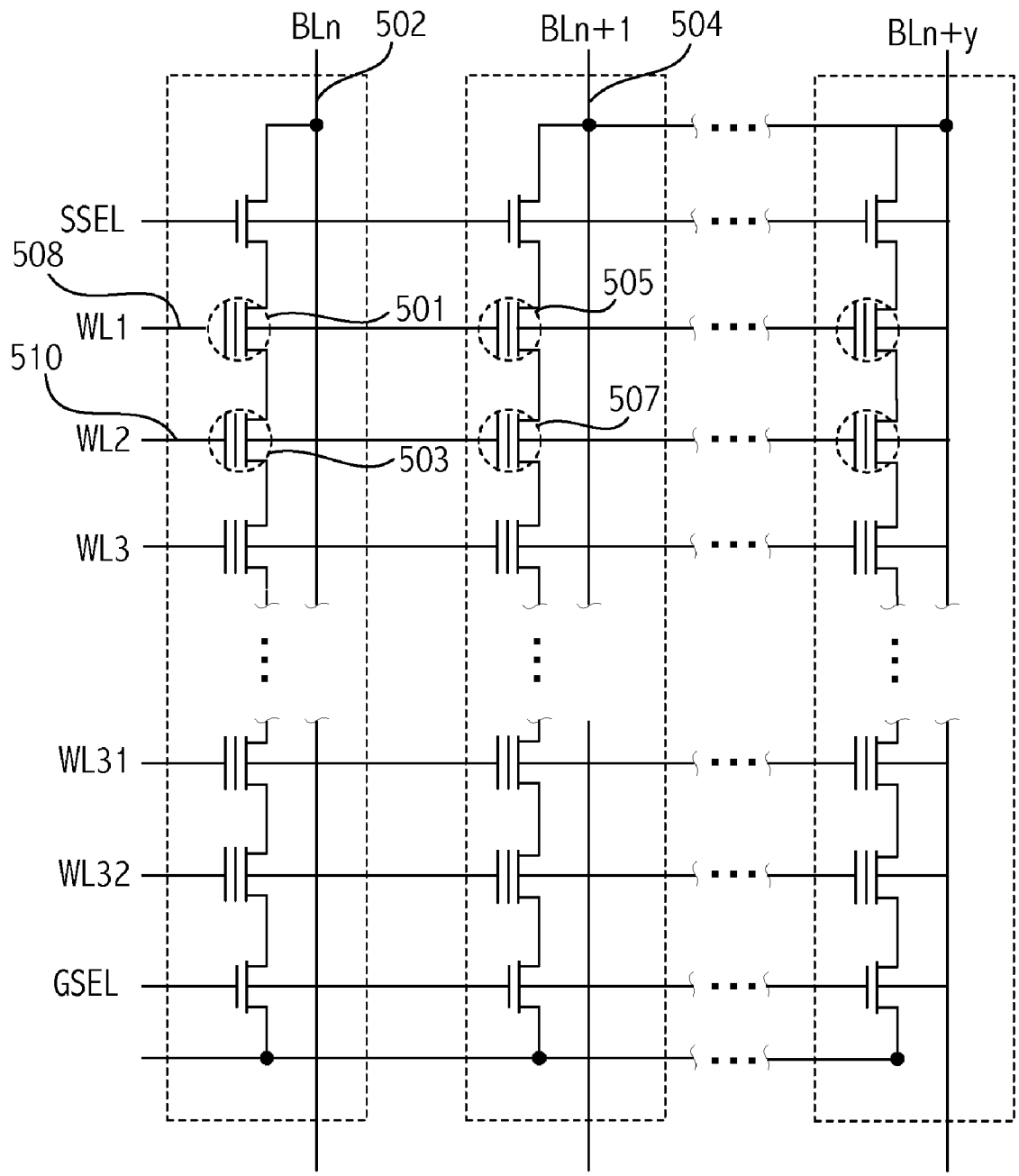
FIG. 5 illustrates additional details of a flash memory illustrating adjacent cells of the flash memory in adjacent wordlines.

Referring to FIG. 5, a portion of a NAND flash array is shown in greater detail. As shown in FIG. 5, respective pairs of adjacent memory cells, e.g., adjacent memory cells 501 and 503, and adjacent memory cells 505 and 507, are on a plurality of bitlines 502 and 504 of a flash memory. Each of the pairs of adjacent memory cells (501, 503 and 505, 507), are located along a respective one of the bitlines (502 and 504) and common to two adjacent wordlines 508 and 510. According to an embodiment of the invention, scrambled data is stored in at least one memory cell of each of the pairs of adjacent memory cells, and unscrambled data is stored in at least one memory cell of at least one of the pairs of adjacent memory cells. For example, scrambled data may be stored in 501 and 507, while unscrambled data is stored in cells 505 and 503. In that way, decorrelation is achieved between the data stored in the cell pair 501 and 503 and between the cell pair 505 and 507. Of course, as shown in FIG. 4, the number of cells that contain scrambled data may include multiple contiguous cells, e.g., sections of 32 cells or greater. Similarly, the section size of unscrambled data may be, e.g., 32 cells or greater. Other embodiments may have more or fewer cells forming the sections of scrambled and unscrambled data.

Figure 6:
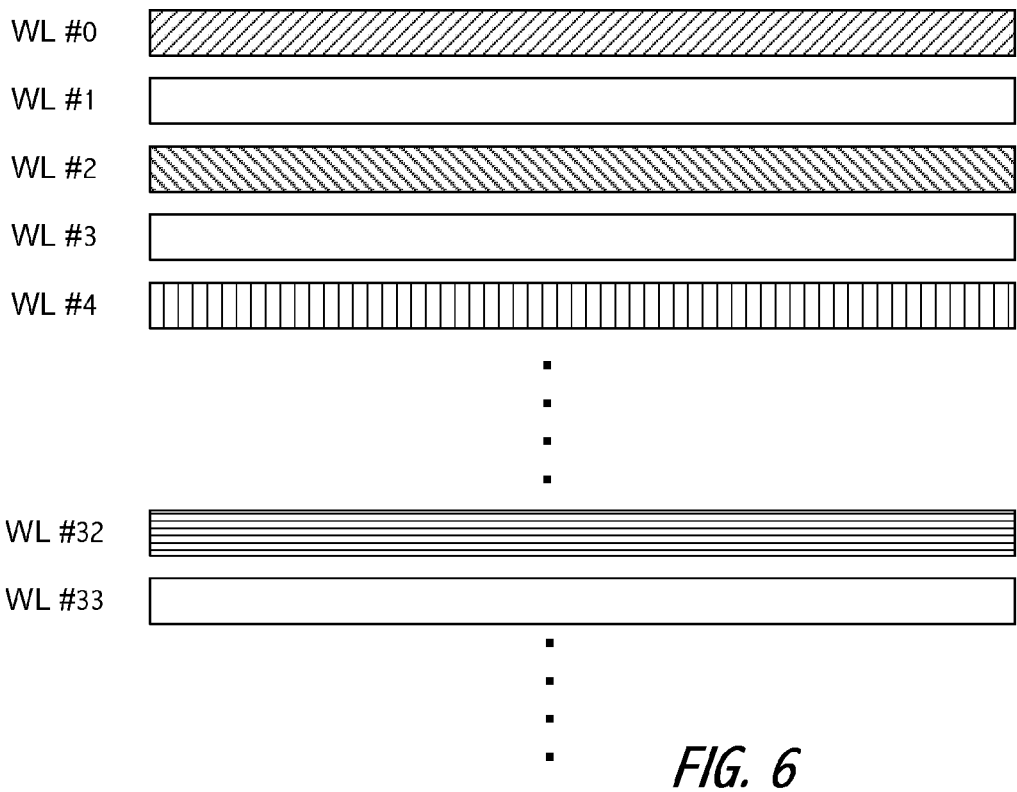
FIG. 6 illustrates a scrambling pattern in which every other wordline is scrambled according to an embodiment of the invention.
Figure 7:
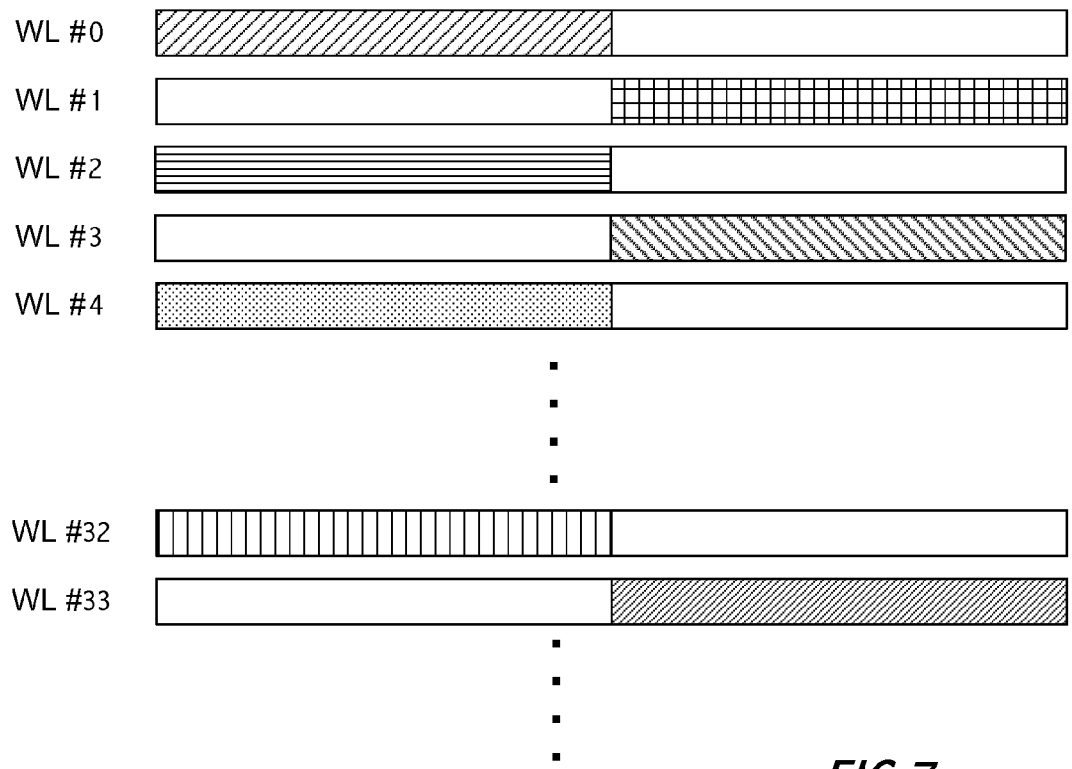
FIG. 7 illustrates a scrambling pattern in which a cube is sized at half the wordline according to an embodiment of the invention.

Thus, in various embodiments each section of cells in a wordline may vary from a single cell up to the entire wordline. Referring to FIG. 6, an exemplary embodiment is illustrated where the cube or section size is the entire wordline. Thus, WL#0 is scrambled and WL#1 is not scrambled. That pattern is repeated for the remaining wordlines, where alternating ones of the wordlines are scrambled. Referring to FIG. 7, illustrated is an embodiment where the section size is half the wordline. As in FIG. 4, alternating sections are scrambled for adjacent wordlines so that for any two adjacent cells on the same bitline and in adjacent wordlines, at least one of the cells will contain scrambled data. Note that in certain embodiments, management information may always remain unscrambled in the wordline. Thus, the embodiments shown in those FIGS. 4, 6, and 7, may be showing scrambling of data exclusive of the management information, which remains unscrambled. In other embodiments, even the management information is scrambled.

Figure 8:
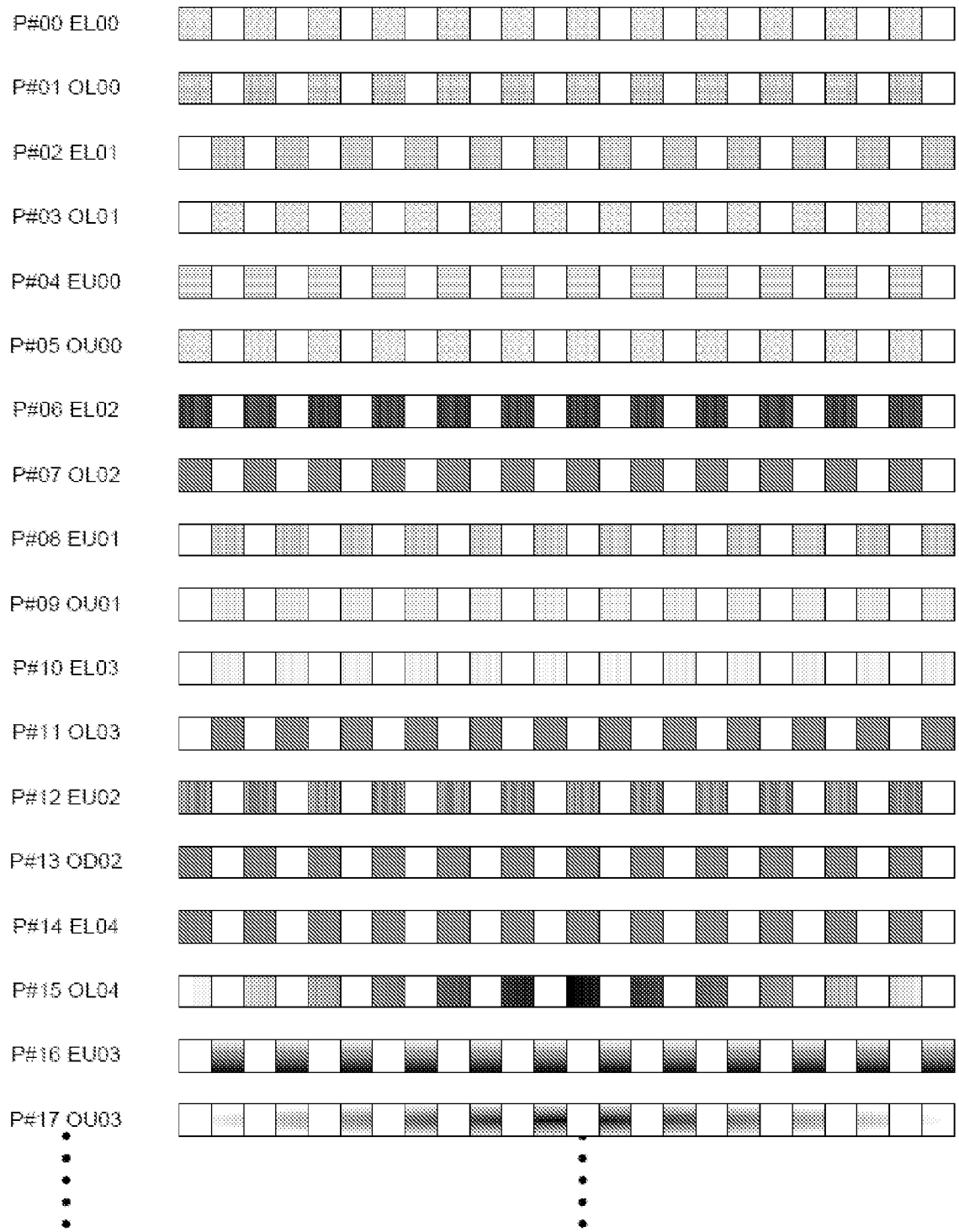
FIG. 8 illustrates scrambling of logical pages and their relationship to the physical wordlines of FIG. 4.

In modern flash memories, logical pages exist that do not align with the physical wordlines. While, in some implementations, a page may correspond to a wordline, in other embodiments, a page may map physically into a portion of a wordline. Referring to FIGS. 4 and 8, illustrated is the way, in one embodiment, that wordlines shown in FIG. 4 relate to the logical pages shown in FIG. 8. For example, in FIG. 8, logical page 0 (P#00) is found on EL00, which is (wordline 0, even lower) shown in FIG. 4. Similarly, logical page 1 (P#01) in FIG. 8 is found on OL00, which is physically (wordline 00, odd lower). Logical page 2 (P#02) is found on EL01, which is physically (wordline 01, even lower). A logical page number may be used to determine the scrambling pattern, but the particular section that is scrambled is determined by the wordline to ensure that adjacent sections in adjacent wordlines are alternately scrambled and unscrambled.

By scrambling only half the data, the decorrelation between cells in the sections (one section scrambled and one section not scrambled) is sufficient to substantially avoid undesired programming effects from correlation of adjacent cells on separate wordlines. Referring again to FIG. 3, scrambling or randomizing half the data reduces by half the computational effort associated with scrambling any particular pair of adjacent wordlines, as only half of the data in the adjacent wordlines needs to be scrambled. In addition, the traffic on RAM bus 303 is reduced as less data needs to be read, scrambled, and stored back into the RAM 305. While the efficiency is gained from scrambling half the data, other embodiments may choose to scramble more than half, with the recognition that efficiency is gained if less than all of the data is scrambled, and effective decorrelation is achieved if at least half the data is scrambled.

In flash memories with multi-bit cells, scrambling all the data bits in a cell with scrambled data may be optimal. However, in certain embodiments, some level of decorrelation can be achieved by scrambling less than all the bits stored in the cell. Thus, for example, for a multi-bit cell containing four bits, scrambling three of the bits may provide a sufficient level of decorrelation, depending, e.g., on such factors as the number of bits stored in the cell, the scrambling pattern used, and the particular programming effects to which a particular flash memory is susceptible. Thus, as used herein, the term "storing scrambled data" in a cell includes storing data in a cell that has had at least one bit of the data scrambled or randomized.

Similarly, when referring to "scrambling (also referred to herein as randomizing) data," it includes both the scrambling of all the bits to be stored in a cell and the scrambling of only some (one or more) of the bits to be stored in a cell, leaving unscrambled the other bits to be stored in the cell.

In an embodiment, the scrambling is implemented in a programmed microcontroller such as microcontroller 301 in FIG. 3. Referring to FIG. 9, exemplary pseudo code to implement the scrambling is shown that may be used to implement the scrambling on appropriate sections of data to be stored in the flash memory. As can be seen in the pseudo code, in the code labeled 1 the wordline number is determined from the page number. In step 2, the decision is made whether to start scrambling on the first section or cube in the wordline. That may be determined from the wordline being even or odd as shown. In step 3, the scrambling key is determined. In step 4 the initial shift register value is determined. In step 5, the cube size in 32 bit words is determined. Other ways to determine the scrambling key may be utilized as well. In an embodiment, the scrambling key is produced using the previous wordline data and current incoming user data. In step 6, if the scrambleThisCube is false, the cube is not scrambled and, otherwise, scrambling is performed on the cube. As will be appreciated by those of skill in the art, the particular implementation shown in FIG. 9 is exemplary and many other implementations may be utilized. For example, one could easily adapt the code shown in FIG. 9 to scramble alternate wordlines as shown in FIG. 6. In addition, rather than implementing the scrambling in a programmed microcontroller, the scrambling operation may be implemented entirely in hardware, or a portion of it may be implemented in hardware.

The foregoing description has described only a few of the many possible implementations of the present invention. For this reason, this detailed description is intended by way of illustration, and not by way of limitation. Variations and modifications of the embodiments disclosed herein may be made based on the description set forth herein, without departing from the scope of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A method for decorrelating between data stored in respective pairs of adjacent memory cells along a plurality of bitlines of a flash memory, each of the pairs of adjacent memory cells being located along a respective one of the bitlines and each of the pairs of adjacent memory cells being located on two adjacent wordlines common to all the pairs, the method comprising:
   storing scrambled data in at least one memory cell of each of the pairs of adjacent memory cells; and
   storing unscrambled data in at least another memory cell of at least one of the pairs of adjacent memory cells;
   wherein storing scrambled data comprises storing in the at least one memory cell one or more bits that are scrambled along with at least one bit that is unscrambled.

2. A method for decorrelating between data stored in respective pairs of adjacent memory cells along a plurality of bitlines of a flash memory, each of the pairs of adjacent memory cells being located along a respective one of the bitlines and each of the pairs of adjacent memory cells being located on two adjacent wordlines common to all the pairs, the method comprising:
   storing scrambled data in at least one memory cell of each of the pairs of adjacent memory cells; and
   storing unscrambled data in at least another memory cell of at least one of the pairs of adjacent memory cells;
   wherein storing the scrambled and unscrambled data further comprises:
   storing scrambled data in a first plurality of memory cells in a first wordline of the two adjacent wordlines and storing unscrambled data in a second plurality of memory cells in a second wordline of the adjacent wordlines, the first and second plurality of cells forming at least some of the pairs of adjacent memory cells.

3. The method as recited in claim 2 wherein storing the scrambled and unscrambled data further comprises:
   storing unscrambled data in a third plurality of memory cells in the first wordline and storing scrambled data in a fourth plurality of memory cells in the second wordline, the third and fourth plurality of cells forming others of the pairs of adjacent memory cells.

4. The method as recited in claim 2 wherein the first plurality of memory cells form a first contiguous section of memory cells across the first wordline and the second plurality of memory cells form a second contiguous section of memory cells across the second wordline.

5. The method as recited in claim 2 wherein the first plurality of memory cells is a subset of all memory cells of the first wordline and the second plurality of memory cells is a subset of all memory cells of the second wordline.

6. The method as recited in claim 2 wherein the first plurality of memory cells includes all cells in the first wordline and the second plurality of memory cells includes all cells in the second wordline.

7. The method as recited in claim 2 further comprising storing scrambled data in only one cell of each of the pairs of adjacent memory cells.

8. The method as recited in claim 2 further comprising storing scrambled and unscrambled data to additional wordlines to form a checkerboard pattern of scrambled and unscrambled data in a plurality of adjacent wordlines of the flash memory including the first and second wordlines.

9. The method as recited in claim 2 further comprising scrambling data in a scrambler circuit to generate the scrambled data.

10. The method as recited in claim 9 further comprising using a number associated with a respective wordline to determine whether to scramble data for a first section of cells in each wordline.

11. The method as recited in claim 10 wherein each wordline is divided into a plurality of sections of memory cells and the scrambling further comprises scrambling data for every other section in each wordline.

12. The method as recited in 2 wherein storing scrambled data comprises storing in the at least one memory cell, one or more bits that are scrambled.

13. A method for decorrelating between data stored in respective pairs of adjacent memory cells along a plurality of bitlines of a flash memory, each of the pairs of adjacent memory cells being located along a respective one of the bitlines and common to first and second adjacent wordlines, the method comprising:
   scrambling a first group of data to generate first scrambled data for storing in the first wordline;
   scrambling a second group of data to generate second scrambled data for storing in the second wordline;

storing the first scrambled data in a first portion of the first wordline and storing unscrambled data in a second portion of the first wordline; and storing the second scrambled data in a third portion of the second wordline adjacent to the second portion of the first wordline, and storing unscrambled data in a fourth portion of the second wordline adjacent to the first portion of the first wordline, thereby storing scrambled data in one memory cell of each of the pairs of adjacent memory cells and storing unscrambled data in another memory cell of each of the pairs of adjacent memory cells.

14. A method for decorrelating between data stored in adjacent memory cells that are located along common bitlines in a set of bitlines of a portion of flash memory, comprising:

storing scrambled data in at least half but not all of the adjacent memory cells common to any two adjacent wordlines of at least three wordlines and the set of bitlines; and storing unscrambled data in remaining ones of the adjacent memory cells common to the any two adjacent wordlines and the set of bitlines;

wherein for each bitline in the set of bitlines scrambled data is stored in at least one of the adjacent memory cells, and wherein for at least one bitline in the set of bitlines unscrambled data is stored in another one of the adjacent memory cells.

* * * * *